(12) United States Patent
Hwang

(10) Patent No.: US 6,824,429 B2
(45) Date of Patent: Nov. 30, 2004

(54) TRANSCEIVER CAGE ASSEMBLY

(75) Inventor: Jenq-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/377,205

(22) Filed: Feb. 27, 2003

(65) Prior Publication Data

US 2004/0077217 A1 Apr. 22, 2004

Related U.S. Application Data

(63) Continuation-in-part of application No. 29/169,351, filed on Oct. 17, 2002, now Pat. No. Des. 481,356, and a continuation-in-part of application No. 29/169,794, filed on Oct. 25, 2002, now Pat. No. Des. 481,677.

(51) Int. Cl.[7] ............................................. H01R 12/00
(52) U.S. Cl. ..................................................... 439/607
(58) Field of Search ............................. 439/607, 79, 80

(56) References Cited

U.S. PATENT DOCUMENTS

| | | |
|---|---|---|
| 6,047,172 A | 4/2000 | Babineau |
| 6,066,001 A | 5/2000 | Liptak |
| 6,109,966 A * | 8/2000 | Chiou ........................ 439/607 |
| 6,430,053 B1 | 8/2002 | Peterson |
| 6,478,622 B1 | 11/2002 | Hwang |
| 6,508,670 B1 | 1/2003 | Hwang |
| 6,666,694 B1 * | 12/2003 | Daly et al. .................... 439/79 |

* cited by examiner

Primary Examiner—Neil Abrams
(74) Attorney, Agent, or Firm—Wei Te Chung

(57) ABSTRACT

A shielding cage assembly (100) for shielding a plurality of transceiver modules (4) therein includes a connecting cover (2) and a plurality of transceiver cages (1). The transceiver cages are arranged in parallel beneath the connecting cover. A plurality of retaining tabs (720a) extends from each conductive cage to pass through corresponding slots (211) defined through the connecting cover. The connecting cover further includes a plurality of mounting pins (221) received in corresponding mounting holes (32) in a printed circuit board (3). An opening (31) is defined through the printed circuit board. The transceiver cages are received in the opening with their bottom portions extending below the circuit board.

25 Claims, 5 Drawing Sheets

TRANSCEIVER CAGE ASSEMBLY

This application is a continuation-in-part of application Ser. No. 29/169,351 filed Oct. 17, 2002, now U.S. Pat. No. D481356, and a continuation-in-part of application Ser. No. 29/169,794 filed Oct. 25, 2002, now U.S. Pat. No. D481,677.

BACKGROUND OF THE INVENTION

1. Field of the Invention

This invention relates generally to a shielding cage and more particularly to a shielding cage assembly for arranging a plurality of small form-factor, pluggable (SFP) transceiver modules therein.

2. Description of the Related Art

A transceiver module is a discrete unit used in interface communications equipments, and is usually singly received in a cage that provides shielding against electromagnetic interference (EMI). Prior art shielded transceiver modules are too difficult to assemble densely to a circuit board. Therefore, an improved, inexpensive shielding cage assembly that will allow transceiver modules to be easily and densely mounted on a circuit board is desired.

SUMMARY OF THE INVENTION

An object of the present invention is to provide a shielding cage assembly for retaining a plurality of transceivers modules therein, said shielding cage assembly being easily mountable to a printed circuit board.

A shielding cage assembly according to the present invention for shielding a plurality of transceiver modules therein includes a connecting cover and a plurality of transceiver cages. The transceiver cages are arranged in parallel, each cage having a plurality of retaining tabs extending therefrom for passing through a plurality of corresponding slots defined through the connecting cover. Thus the transceiver cages are retained to the connecting cover. The connecting cover further includes a plurality of mounting pins for being received in corresponding mounting holes of a printed circuit board. An opening is defined in the printed circuit board for receiving the transceiver cages therein, a bottom portion of each transceiver cage extending below the circuit board.

Other objects, advantages and novel features of the present invention will be drawn from the following detailed description of a preferred embodiment of the present invention, with attached drawings, in which:

DETAILED DESCRIPTION OF THE PREFERRED EMBODIMENT

Figure 1:
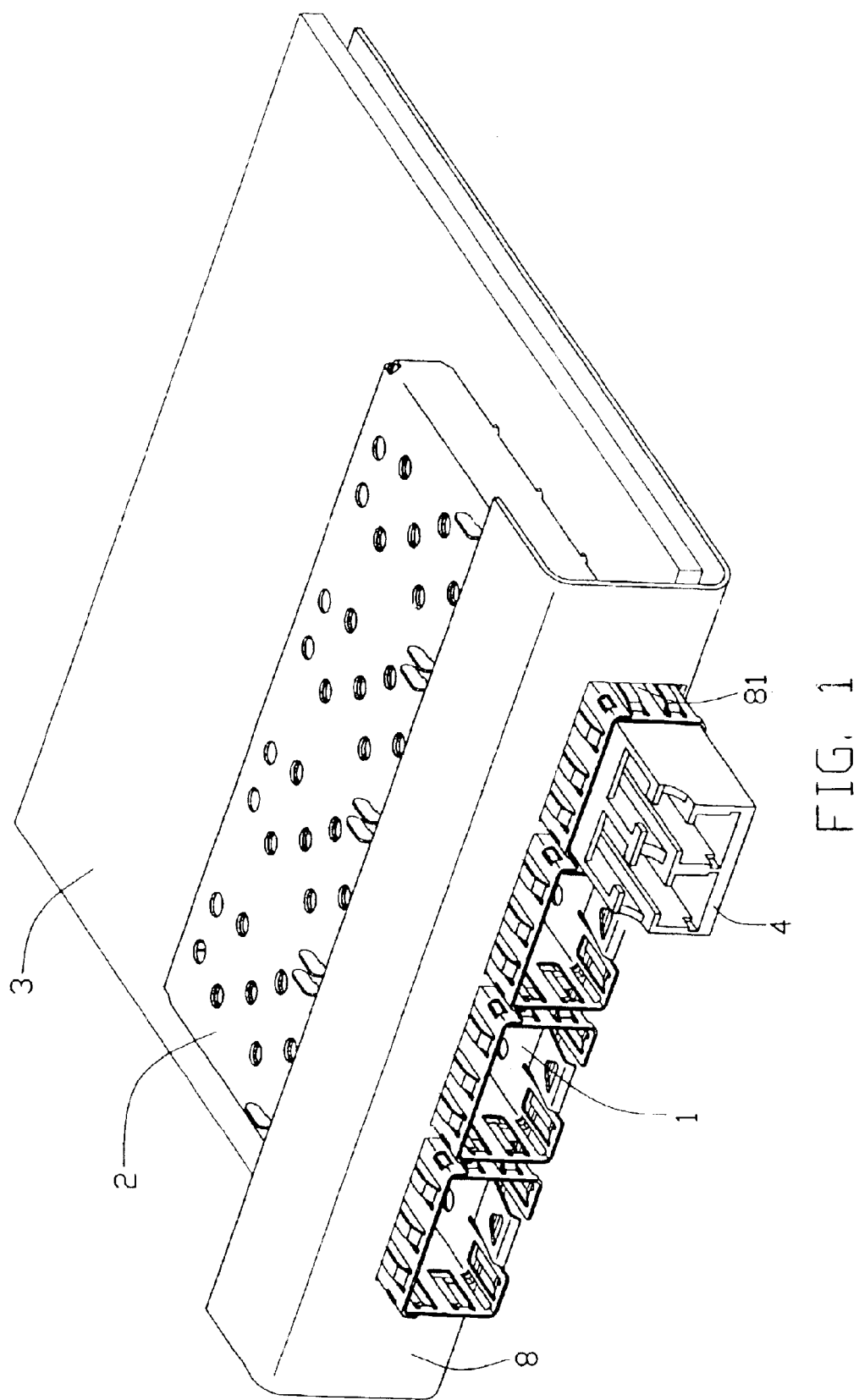
FIG. 1 is an assembled, perspective view of a shielding cage assembly in accordance with the present invention, mounted to a printed circuit board and protruding through a front panel.
Figure 2:
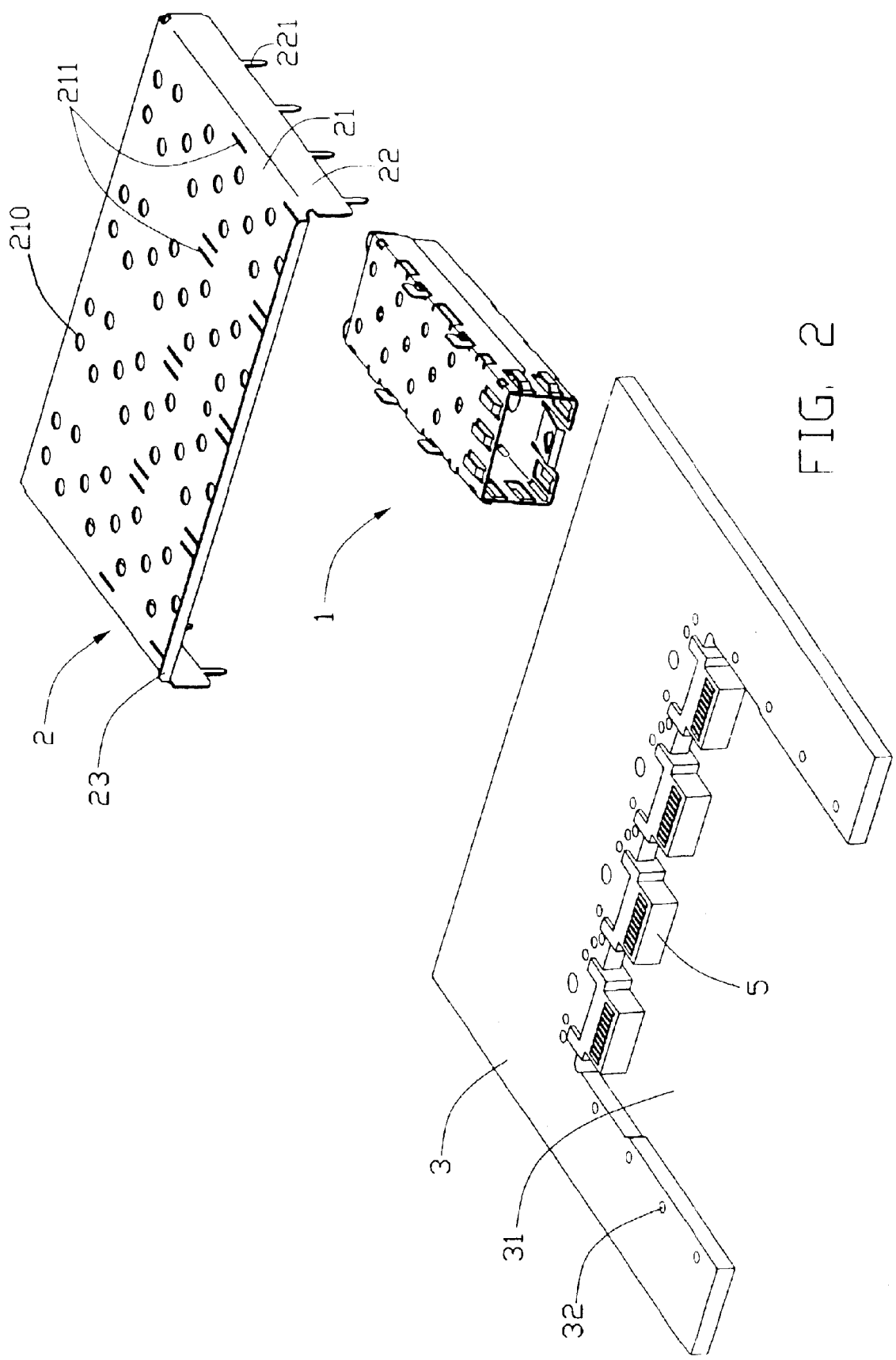
FIG. 2 is an exploded view of the shielding cage assembly with the printed circuit board.
Figure 3:
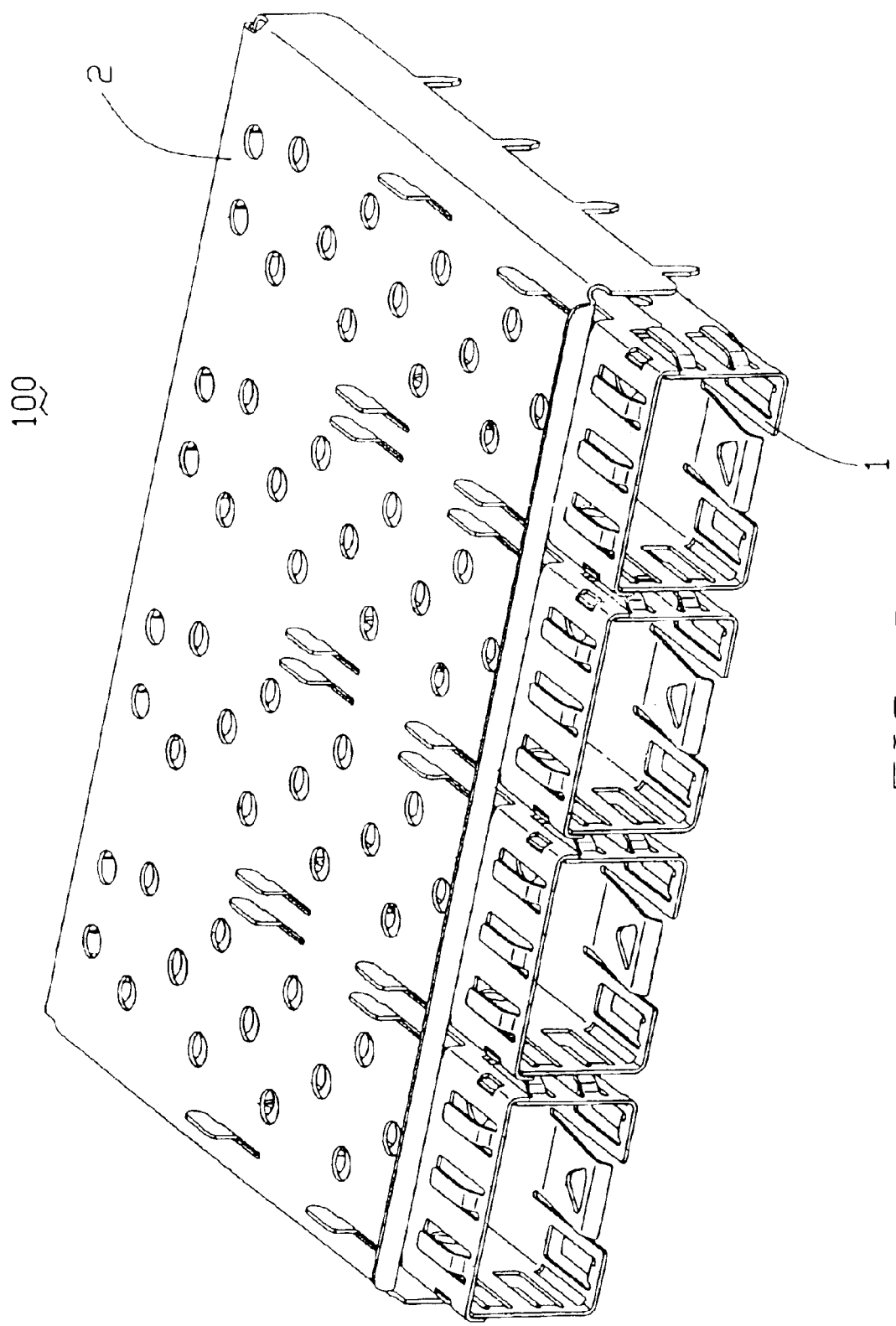
FIG. 3 is a perspective view of the shielding cage assembly of FIG. 1 from a top-side aspect.

Referring to FIGS. 1 to 3, a shielding cage assembly 100 in accordance with the present invention comprises a plurality of transceiver cages 1 and a conductive connecting cover 2. The transceiver cages 1 are arranged in parallel and each respectively receives a corresponding transceiver module 4 therein. The connecting cover 2 engages with the transceiver cages 1 and is fixed to the printed circuit board 3. A front panel 8 having a plurality of windows 81 is coupled to the circuit board 3, and front ends of the transceiver cages 1 extend out of the windows 81.

Figure 4:
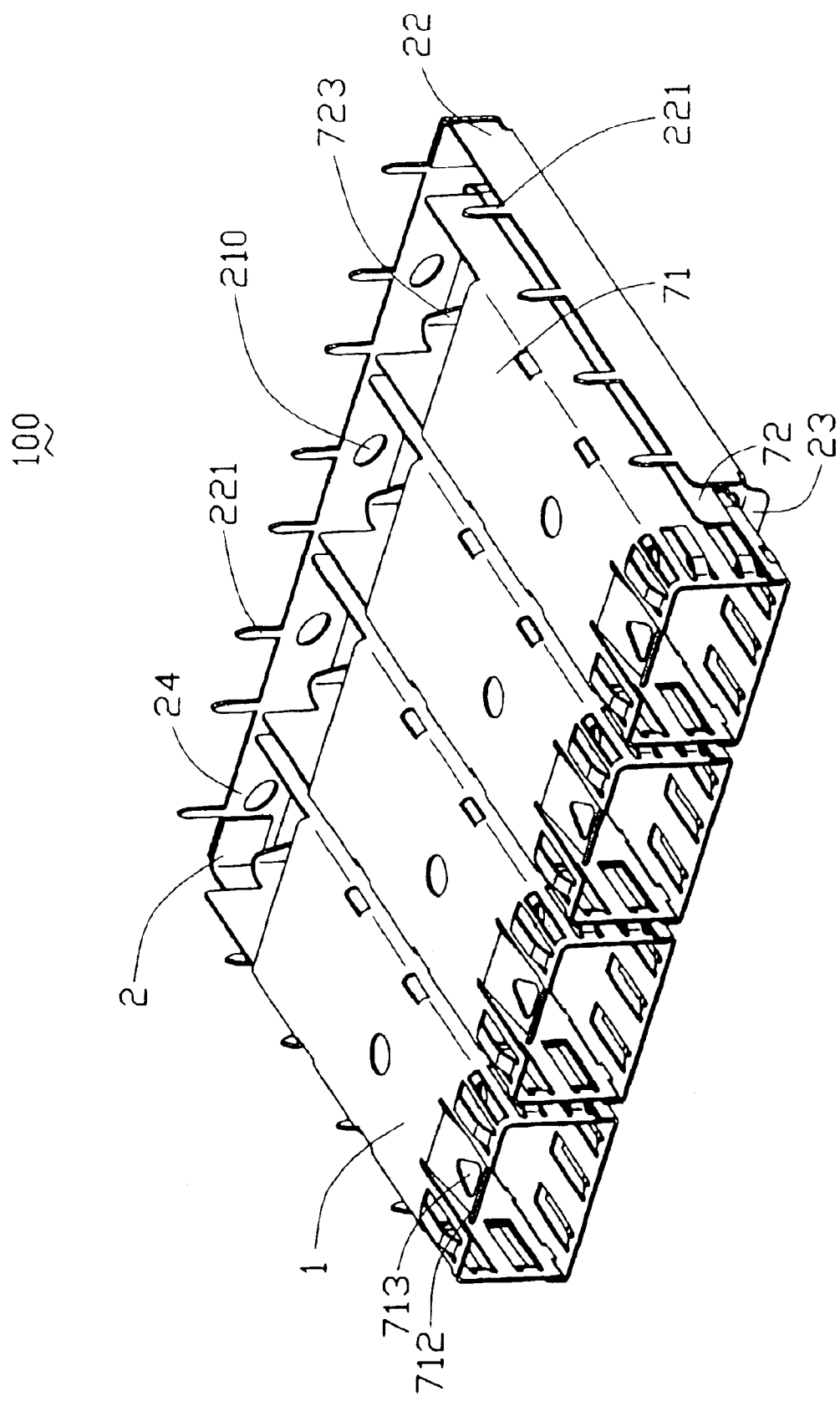
FIG. 4 is a perspective view of the shielding cage assembly of FIG. 1 from a bottom-side aspect.
Figure 5:
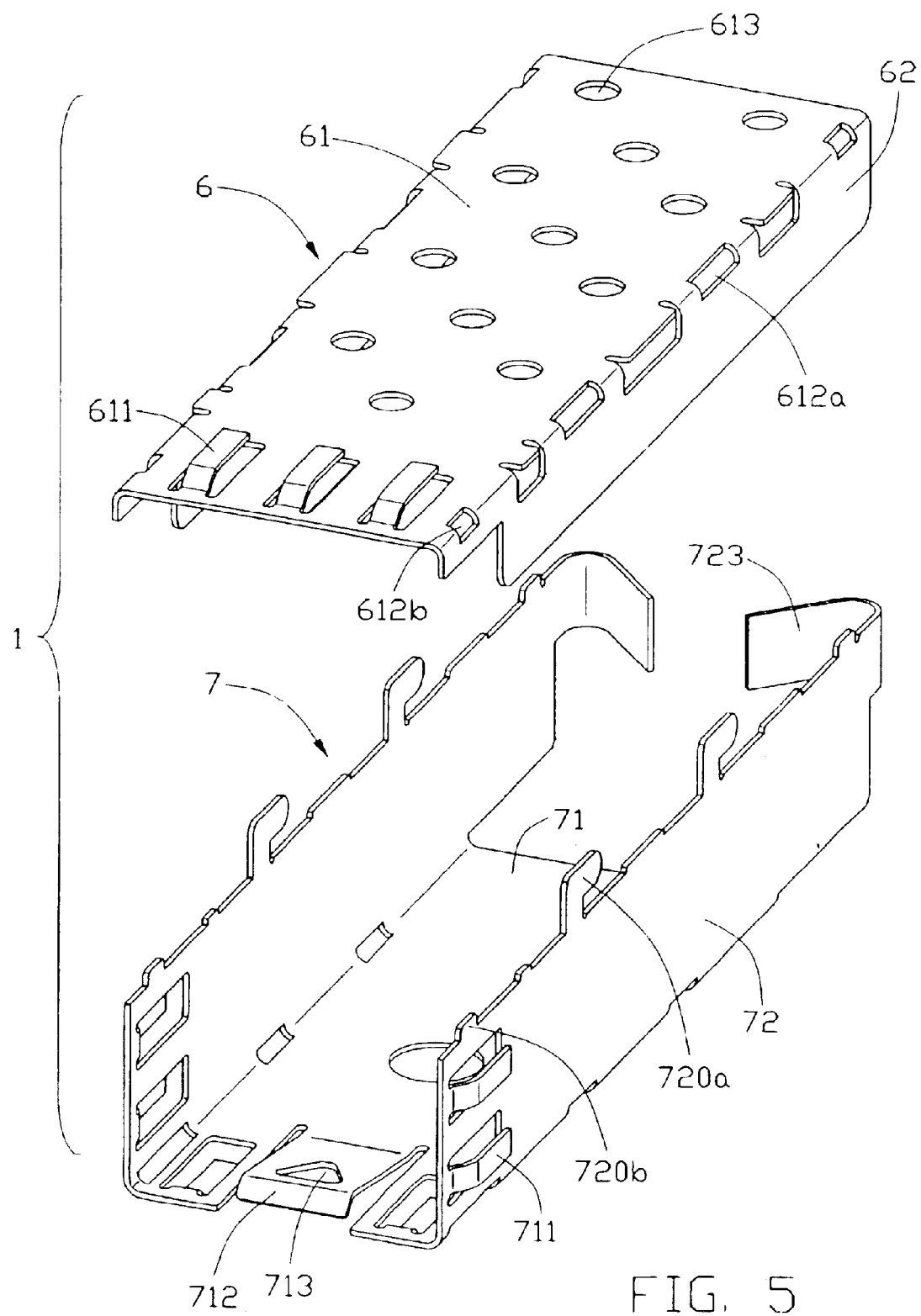
FIG. 5 is an exploded view of a transceiver cage of the shielding cage assembly of FIG. 1.

Referring to FIGS. 4 and 5, each transceiver cage 1 is made of electrically conductive material, and includes an upper cage 6 and a bottom cage 7. The upper cage 6 includes a top wall 61 with two first side walls 62 extending downwardly therefrom. A plurality of through holes 613 is defined through the top wall 61 for heat-transmission during operation of the transceiver modules 4. A plurality of spring tabs 611 extends outwardly at an angle from a front end of the top wall 61 for EMI suppression. A plurality of slots 612a is defined at an intersection of the top wall 61 and each first side wall 62. A pair of cutouts 612b is respectively defined at a front end and at a rear end of each intersection. The bottom cage 7 includes a bottom wall 71 with two second side walls 72 extending upwardly therefrom. A width of the bottom cage 7 is a little less than that of the upper cage 6. A plurality of spring tabs 711 extends outwardly from a front end of the bottom wall 71 and the second side walls 72. A releasing tab 712 extends inwardly at an angle from a middle of the front end of the bottom wall 71. A triangle shaped opening 713 is defined through the releasing tab 712, for engaging of the releasing tab 712 with a transceiver module 4 inserted into the transceiver cage 1. The releasing tab 712 can be depressed to remove the transceiver module 4 from the transceiver cage 1. Each second side wall 72 includes a plurality of retaining tabs 720a and a pair of projections 720b extending upwardly from its top edge. The retaining tabs 720a align with corresponding slots 612a in the upper cage 6, and each has an elbowed engaging portion. The projections 720b align with the corresponding cutouts 612b of the upper cage 6. A pair of curved spring arms 723 extends frontward and inwardly from respective rear ends of the second side walls 72. When the transceiver module 4 is inserted into the transceiver cage 1, the spring arms 723 are pressed and deformed rearwardly. To remove the transceiver module 4 from the transceiver cage 1, the release tab 712 is depressed, and the spring arms 723 are released and push the transceiver module 4 out of the transceiver cage 1.

To assemble the transceiver cage 1, the upper cage 6 engages with the bottom cage 7, the first side walls 62 overlie the second side walls 72, the retaining tabs 720a of the bottom cage 7 pass through the corresponding slots 612a of the upper cage 6, and the projections 720b are respectively soldered in the corresponding cutouts 612b in the upper cage 6. Thus the assembly of the transceiver cage 1 is completed.

Referring to FIGS. 2 and 4, the connecting cover 2 is also made of electrically conductive material and includes a top plate 21 with two side plates 22, a front plate 23 and a back plate 24. The top plate 21 is flat and rectangular and has a plurality of through holes 210 defined therethrough for heat-transmission during operation of the transceiver modules 4. A plurality of retaining slots 211 is defined through the top plate 21, arranged in parallel lines in a frontward to rearward direction. Each pair of retaining slots 211 corresponds to a pair of retaining tabs 720a extending from the two second side walls 72 of a respective transceiver cage 1. A width of the top plate 21 is larger than a sum of the widths of the plurality of the transceiver cages 1. This arrangement allows maintenance of a space between each of two adjacent transceiver cages 1 when the transceiver cages 1 are retained to the connecting cover 2. The front plate 23 extends upwardly and vertically from a front end of the connecting cover 2 to enhance the strength of the connecting cover 2. The two side plates 22 and the back plate 24 respectively extend downwardly from the top plate 21. A plurality of mounting pins 221 extends downwardly from the side plates 22 and back plate 24. A height of the connecting cover 2 is shorter than a height of an assembled transceiver cage 1. A plurality of through holes 210 is also defined through the back plate 24 for heat-transmission during operation of the transceiver modules 4.

To assemble the transceiver cages 1 to the connecting cover 2, the retaining tabs 720*a* of each transceiver cage 1 are inserted through the corresponding retaining slots 211 of the connecting cover 2, and then the transceiver cage 1 is fully pushed backward relative to the connecting cover 2. This leaves the front ends of the transceiver cages 1 exposed at a front of the connecting cover 2. The transceiver cages 1 are soldered to the connecting cover 2, completing assembly of the plurality of transceiver cages 1 to the connecting cover 2.

Referring to FIG. 2, the printed circuit board 3 defines a U-shaped opening 31 and a plurality of mounting holes 32 surrounding the opening 31. A plurality of electrical connectors 5 is located at a rear end of the opening 31 of the circuit board 3.

Referring back to FIG. 1, the shielding cage assembly 100 is shown mounted to the printed circuit board 3. The mounting pins 221 of the connecting cover 2 are inserted into corresponding mounting holes 32 of the circuit board 3. The transceiver cages 1 are received within the opening 31 of the circuit board 3, with bottoms of the transceiver cages 1 extending below the opening 31 of the circuit board 3. The front panel 8 defines a plurality of rectangular windows 81 therethrough. Front ends of the transceiver cages 1 respectively extend out of corresponding windows 81. The spring tabs 611, 711 of the transceiver cages 1 tightly fit against sides of the window 81 for EMI suppression. The transceiver modules 4 are respectively inserted into corresponding transceiver cages 1, their rear ends engaging with the electrical connectors 5 and their front ends being exposed out of the transceiver cages 1.

The shielding cage assembly 100 according to the present invention uses a connecting cover 2 to hold a plurality of transceiver cages 1 together, and the mounting pins 221 of the connecting cover 2 are inserted into the mounting holes 32 of the circuit board 3, thereby completing the assembly of the transceiver cages 1 to the circuit board 3, and simplifying the assembling operation. In addition, the bottoms of the transceiver cages 1 are below the circuit board 3 so that the height of the shielding cage assembly 100 on the circuit board 3 is decreased, resulting in a lower-profile mounting of the shielding cage assembly 100 on the circuit board 3.

Although the present invention has been described with specific terms, it should be noted that the described embodiments are not necessarily exclusive, and that various changes and modifications may be made thereto without departing from the scope of the present invention as defined in the appended claims.

What is claimed is:

1. A shielding cage assembly for accommodating a plurality of transceiver modules, comprising:

a plurality of conductive cages for enclosing a respective plurality of transceiver modules therein, each including an upper cage and a lower cage, a plurality of retaining tabs extending upwardly from the lower cage and passing through the upper cage; and a conductive connecting cover including a top wall with two side walls, a plurality of through slots being defined through the top wall and a plurality of mounting pins extending downwardly from the side walls; wherein the retaining tabs of the conductive cages are inserted through the through slots of the connecting cover and are retained in the connecting cover, so that the connecting cover holds the conductive cages together in a parallel arrangement.

2. The shielding cage assembly as described in claim 1, wherein the connecting cover further includes a vertical wall extending upwardly therefrom for enhancing the strength of the connecting cover.

3. The shielding cage assembly as described in claim 1, wherein a plurality of spring tabs extends from each conductive cage for EMI suppression.

4. The shielding cage assembly as described in claim 1, wherein the conductive cages are fixed to the connection cover using solder.

5. The shielding cage assembly as described in claim 1, wherein a plurality of through holes is defined respectively through the conductive cages and through the connecting cover for heat-transmission.

6. The shielding cage assembly as described in claim 1, wherein a space exists between each of two adjacent conductive cages attached to the connecting cover.

7. The shielding cage assembly as described in claim 1, wherein a releasing tab is formed on each conductive cage for holding a transceiver module therein.

8. The shielding cage assembly as described in claim 1, wherein a front end of each conductive cage is exposed out of the connecting cover.

9. A shielding cage assembly mounting to a printed circuit board for accommodating transceiver modules, comprising:

a plurality of conductive cages for respectively enclosing a plurality of transceiver modules therein, said conductive cages being retained in a connecting cover, said connecting cover being mountable to the printed circuit board, a bottom section of each of said conductive cages extending below a top surface of the printed circuit board, and interengaging means respectively provided on the connecting cover and the conductive cages, so as to have said conductive cages fastened to and essentially under said connecting cover in a suspended manner.

10. The shielding cage assembly as described in claim 9, wherein a plurality of retaining tabs extends upwardly from at least a side section of each conductive cage.

11. The shielding cage assembly as described in claim 10, wherein said connecting cover defines a plurality of slots therethrough to receive the correspond retaining tabs of the conductive cages.

12. The shielding cage assembly as described in claim 9, wherein a plurality of mounting pins extends downwardly from a side section of said connecting cover for being received in a corresponding plurality of mounting holes defined through the circuit board.

13. The shielding cage assembly as described in claim 9, wherein said conductive cages are arranged in parallel beneath said connecting cover.

14. The shielding cage assembly as described in claim 9, wherein a plurality of spring tabs extends from said conductive cages for protection against EMI.

15. The shielding cage assembly as described in claim 9, wherein a releasing tab is formed on each conductive cage for securing a transceiver module therein.

16. The shielding cage assembly as described in claim 9, wherein an opening is defined through the printed circuit board to accept the plurality of conductive cages therein.

17. The shielding cage assembly as described in claim 9, wherein a front end of each conductive cage is exposed out of said connecting cover.

18. The shielding cage assembly as described in claim 9, wherein a space exists between each two adjacent conductive cages.

19. A shielding cage assembly comprising:

a printed circuit board defining an opening in an edge portion thereof;

a plurality of connectors positioned around an inner edge of said opening;

a cover defining side walls mounted on the printed circuit board and a top wall upwardly spaced from a top surface of the printed circuit board, said side walls cooperating with said top wall to shield said opening in a vertical direction;

a plurality of conductive cages arranged side by side with one another; and interengaging means provided on the top wall of the cover and said cages to fix the cover and said cages together whereby said cages are suspended in said opening.

20. The assembly as described in claim 19, wherein a bottom portion of each of said cages is located below the top surface of the printed circuit board.

21. The assembly as described in claim 19, wherein said cages are not directly fastened to the printed circuit board.

22. A shielding cage assembly comprising:

a printed circuit board;

a plurality of connectors positioned on the printed circuit board;

a cover defining side walls mounted on the printed circuit board and a top wall upwardly located between the side walls and spaced from a top surface of the printed circuit board, said side walls cooperating with at least said top wall to commonly define therein a cavity in communication with exterior in a front-to-back direction;

a plurality of conductive cages side by side arranged with one another and located in the cavity; and interengaging means provided on the top wall of the cover and the cages to fix the cover and the respective cages together thereby said cages being suspended in said cavity.

23. The shielding cage assembly as described in claim 22, wherein said cages essentially are not engaged with the printed circuit board for securement therebetween.

24. The shielding cage assembly as described in claim 22, wherein said cover is metallic and extend with a sufficient distance along said front-to-back direction to shield rear portions of said cages.

25. A cage assembly comprising:

a metallic cover defining side walls adapted to be mounted on the printed circuit board and a top wall upwardly located between the side walls and adapted to be spaced from a top surface of the printed circuit board, said side walls cooperating with at least said top wall to commonly define therein a cavity in communication with exterior in a front-to-back direction;

a plurality of conductive cages side by side arranged with one another and located in the cavity; and interengaging means provided on the top wall of the cover and the cages to fix the cover and the respective cages together thereby said cages being suspended in said cavity, wherein said cover extends along the front-to-back direction with a sufficient distance and the interengaging means is arranged to be located in more than one positions along said front-to-back direction so as to have said cages reliably suspended under said to wall.

* * * * *